(12) United States Patent
Lewis et al.

(10) Patent No.: US 7,746,100 B2
(45) Date of Patent: Jun. 29, 2010

(54) FLEXIBLE ADDER CIRCUITS WITH FAST CARRY CHAIN CIRCUITRY

(75) Inventors: David Lewis, Toronto (CA); Jeffrey Christopher Chromczak, Brownsville (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/111,142

(22) Filed: Apr. 28, 2008

(65) Prior Publication Data

US 2009/0267643 A1 Oct. 29, 2009

(51) Int. Cl.
*H03K 19/177* (2006.01)
*G06F 7/42* (2006.01)

(52) U.S. Cl. .............................. 326/38; 326/10; 326/39; 708/505; 708/670

(58) Field of Classification Search ............. 326/38–41, 326/10; 708/505, 670
See application file for complete search history.

(56) References Cited

U.S. PATENT DOCUMENTS

| 5,349,250 | A | 9/1994 | New |
| 5,481,206 | A | 1/1996 | New et al. |
| 5,898,602 | A | 4/1999 | Rothman et al. |
| 6,292,019 | B1 * | 9/2001 | New et al. ...................... 326/41 |
| 7,003,545 | B1 | 2/2006 | Mohammed et al. |
| 7,061,268 | B1 * | 6/2006 | Lee et al. ...................... 326/39 |

* cited by examiner

*Primary Examiner*—Vibol Tan
(74) *Attorney, Agent, or Firm*—Treyz Law Group; G. Victor Treyz; David C. Kellogg

(57) ABSTRACT

Configurable adder circuitry is provided on an integrated circuit that includes redundant circuitry. The integrated circuit may contain nonvolatile memory and logic circuitry that produces a redundancy control signal. During manufacturing, the integrated circuitry may be tested. If a defect is identified on the integrated circuit, the redundancy control signal may be used in switching redundant circuitry into place bypassing the defect. The integrated circuit may contain an array of logic regions. Each logic region may contain adders and multiplexer circuitry for selectively combining the multiplexers to form larger adders. The multiplexer circuitry in each logic region may be controlled by propagate signals from the adders and by static redundancy control signals.

23 Claims, 13 Drawing Sheets

| CARRY IN TO TOP HALF OF LAB ||| 
|---|---|---|
| MODE | ADJBAD | CARRY IN FOR TOP |
| TOP | X | 0 |
| MIDDLE | 0 | $C_{IN}$ (ROW-1) |
| MIDDLE | 1 | $C_{IN}$ (ROW-2) |

FIG. 6

| CARRY IN TO BOTTOM HALF OF LAB ||||
|---|---|---|---|
| MODE | ADJBAD | PTOP | CARRY IN FOR BOTTOM |
| TOP | X | X | CTOP |
| MIDDLE | X | 0 | CTOP |
| MIDDLE | 0 | 1 | $C_{IN}$ (ROW-1) |
| MIDDLE | 1 | 1 | $C_{IN}$ (ROW-2) |
| OFF | X | X | 0 |

FIG. 7

| CARRY OUT FROM LAB (LAB C$_{OUT}$) | | | | |
|---|---|---|---|---|
| MODE | ADJBAD | PTOP | PBOT | LAB C$_{OUT}$ |
| TOP | X | X | 1 | CTOP |
| TOP | X | X | 0 | CBOT |
| TOP HALF | X | X | X | CTOP |
| MID | X | X | 0 | CBOT |
| MID | X | 0 | 1 | CTOP |
| MID | 0 | 1 | 1 | C$_{IN}$ (ROW-1) |
| MID | 1 | 1 | 1 | C$_{IN}$ (ROW-2) |
| SKIPBOT | X | 0 | X | CTOP |
| SKIPBOT | 0 | 1 | X | C$_{IN}$ (ROW-1) |
| SKIPBOT | 1 | 1 | X | C$_{IN}$ (ROW-2) |
| OFF | X | X | X | 0 |

| CARRY IN TO TOP HALF OF LAB |||
|---|---|---|
| MODE | ADJBAD | CARRY IN FOR TOP |
| TOP | X | 0 |
| MIDDLE | 0 | $C_{IN}$ (ROW-1) |
| MIDDLE | 1 | $C_{IN}$ (ROW-2) |

FIG. 10

| MODE | ADJBAD | PTOP | CARRY IN FOR BOTTOM |
|---|---|---|---|
| TOP | X | X | CTOP0 |
| MIDDLE | X | 0 | CTOP0 |
| MIDDLE | 0 | 1 | $C_{IN}$ (ROW-1) |
| MIDDLE | 1 | 1 | $C_{IN}$ (ROW-2) |
| OFF | X | X | 0 |

FIG. 11

| CARRY OUT FROM LAB (LAB C$_{OUT}$) ||||||
|---|---|---|---|---|
| MODE | ADJBAD | PTOP | PBOT | LAB C$_{OUT}$ |
| TOP | X | X | 0 | CBOT0 |
| TOP | X | X | 1 | CTOP0 |
| TOP HALF | X | X | X | CTOP0 |
| MID | X | X | 0 | CBOT0 |
| MID | X | 0 | 1 | CTOP0 |
| MID | 0 | 1 | 1 | C$_{IN}$ (ROW-1) |
| MID | 1 | 1 | 1 | C$_{IN}$ (ROW-2) |
| SKIPBOT | X | 0 | X | CTOP0 |
| SKIPBOT | 0 | 1 | X | C$_{IN}$ (ROW-1) |
| SKIPBOT | 1 | 1 | X | C$_{IN}$ (ROW-2) |
| OFF | X | X | X | 0 |

FIG. 12

FLEXIBLE ADDER CIRCUITS WITH FAST CARRY CHAIN CIRCUITRY

BACKGROUND

This invention relates to integrated circuits, and more particularly, to configurable circuitry that may be used to implement adders.

Adders are used to perform binary addition in digital integrated circuits. For example, a five bit adder may be used to compute a binary sum of two five bit binary inputs.

Adders are widely used on integrated circuits such as programmable logic devices. Programmable logic device integrated circuits contain programmable logic that may be programmed to implement a desired custom logic design. In some device architectures, programmable logic is organized in regions. Each logic region may contain configurable adder circuits. When a logic designer desires to implement an adder that is larger than an individual adder circuit, the circuitry on the programmable logic device can be selectively configured to combine multiple adder circuits.

Programmable logic device integrated circuits may also contain redundant circuitry. Redundant circuitry may be used to repair a programmable logic device that contains a defect. Fuses may be used to control redundancy multiplexers. When a defective circuit is identified during manufacturing, the fuses may be used to configure the redundancy multiplexers so that the redundant circuitry is switched into use in place of the defective circuits.

Adders produce carry signals. When forming relatively large adders from smaller adder circuits, the carry signals from the smaller adder circuits must be routed appropriately. In programmable logic device integrated circuits with redundant circuitry, redundancy multiplexers are used to form part of the carry signal paths between adders. The redundancy multiplexers are used to route the carry signals appropriately when a defective portion of circuitry is being bypassed.

However, in programmable logic device integrated circuits arrangements in which redundancy multiplexers are used to form adder carry chains, the presence of the redundancy multiplexer circuitry can introduce undesirable carry propagation delays. These delays can limit adder performance, regardless of whether a particular device contains a circuit defect.

It would be desirable to be able to provide improved adder circuitry for integrated circuits such as programmable integrated circuits with redundancy circuitry.

SUMMARY

In accordance with the present invention, integrated circuits such as programmable integrated circuits are provided that contain redundant circuitry. If a defect is detected on an integrated circuit, the defect may be bypassed and the redundant circuitry may be switched into use.

A programmable integrated circuit such as a programmable logic device integrated circuit may contain an array of logic regions. Redundancy may be implemented by providing one or more rows of redundant logic regions. Each logic region may contain first and second adders. The adders may be combined when it is desired to form an adder of increased width. Even larger adders may be formed by chaining together adders from multiple logic regions.

Carry and propagate signals may be produced by the adders. Multiplexer circuits may be used to route carry signals between the adders. The same multiplexer circuits may also be used in implementing redundancy. Control inputs on the multiplexers may be responsive to the propagate signals from the adders and static redundancy control signals. The static redundancy control signals may be produced by non-volatile memory and logic circuitry. For example, fuses and logic may be used to produce the static redundancy control signals.

The multiplexer circuitry may be used to combine the adders in each logic region and may be used to support redundancy. Because the multiplexer circuitry performs both adder configuration and redundancy functions, carry chain paths in the adders include fewer multiplexer delays than carry chain paths in conventional configurable adders.

Further features of the invention, its nature and various advantages will be more apparent from the accompanying drawings and the following detailed description of the preferred embodiments.

BRIEF DESCRIPTION OF THE DRAWINGS

FIGS. 6, 7, and 8 are diagrams showing signals involved in operating the illustrative adder circuitry of FIG. 5 in different modes in accordance with an embodiment of the present invention.

FIGS. 10, 11, and 12 are diagrams showing signals involved in operating the illustrative adder circuitry of FIG. 9 in different modes in accordance with an embodiment of the present invention.

DETAILED DESCRIPTION

The present invention relates to improving adder circuitry performance in logic circuits. The logic circuits may be part of any suitable integrated circuits. For example, logic circuits and adder circuitry of the present invention may be implemented on programmable logic device integrated circuits. Logic circuits and adder circuitry of the present invention may also be implemented on custom logic circuits, digital signal processors, microprocessors, or other integrated circuits in which addition operations are to be performed. Redundancy circuitry may be implemented on these integrated circuits.

If desired, logic circuits and adder circuitry with redundancy capabilities in accordance with the invention may be implemented on programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic. The present invention will generally be described in the context of integrated circuits such as programmable logic device integrated circuits as an example.

Figure 1:
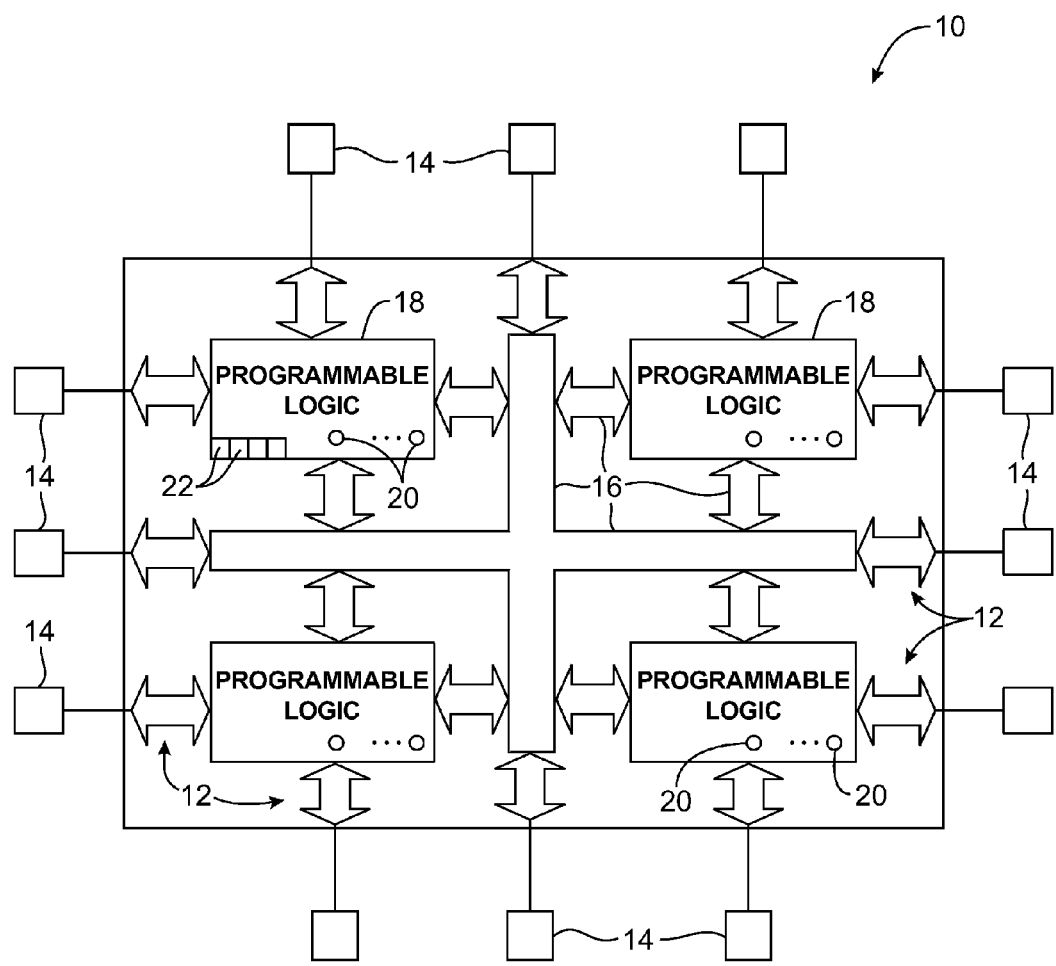
FIG. 1 is a diagram of an illustrative integrated circuit such as a programmable logic device integrated circuit with adder circuitry in accordance with an embodiment of the present invention.

An illustrative integrated circuit such as a programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include conductive lines and programmable connections between respective conductive lines and are therefore sometimes referred to as programmable interconnects 16.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control signal that controls the operation of an associated logic component in programmable logic 18. In a typical scenario, the outputs of the loaded memory elements 20 are applied to the gates of metal-oxide-semiconductor transistors in programmable logic 18 to turn certain transistors on or off and thereby configure the logic in programmable logic 18 and routing paths. Programmable logic circuit elements that may be controlled in this way include parts of multiplexers (e.g., multiplexers used for forming routing paths in programmable interconnects 16), look-up tables, logic arrays, AND, OR, NAND, and NOR logic gates, pass gates, etc.

Memory elements 20 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 20 are loaded with configuration data during programming, memory elements 20 are sometimes referred to as configuration memory, configuration RAM (CRAM), or programmable memory elements.

The circuitry of device 10 may be organized using any suitable architecture. As an example, the logic of programmable logic device 10 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (as an example). The larger regions may be, for example, logic array blocks (LABs) containing multiple logic elements or multiple ALMs. In the example of FIG. 1, illustrative logic regions 22 (which may be, for example, LEs or ALMs) are shown in one of the larger regions of programmable logic 18 in FIG. 1 (which may be, for example, a logic array block). In a typical programmable logic device 10, there may be hundreds or thousands of smaller logic regions 22. The logic regions 22 that are shown in FIG. 1 are merely illustrative.

During device programming, configuration data is loaded into device 10 that configures the programmable logic regions 22 and programmable logic regions 18 so that their logic resources perform desired logic functions on their inputs and produce desired output signals. For example, CRAM cells are loaded with appropriate configuration data bits to configure adders and other circuits on device 10 to implement desired custom logic designs.

The resources of device 10 such as programmable logic 18 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic array blocks or other such logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Integrated circuit 10 may have redundant circuitry. Integrated circuits with redundant circuitry can be repaired during manufacturing.

Integrated circuits are manufactured using complex semiconductor fabrication techniques. One figure of merit when producing integrated circuits is a circuit's manufacturing yield. Circuits that are extremely complex or that are fabricated using cutting-edge processes are generally more difficult to produce without faults than more established circuit designs. As a result, manufacturing yields for newer and more complex circuits are sometimes lower than the manufacturing yields of older designs. Yields can also be negatively affected when designing high performance chips, because devices of this type contain smaller line widths and more complex structures, making them more difficult to manufacture.

Poor manufacturing yields can adversely affect the profitability of an integrated circuit design. In some situations, yields may be so low as to make volume production unfeasible. It is therefore desirable to enhance manufacturing yields whenever possible. This can make otherwise unprofitable integrated circuits economical to manufacture. Enhanced yields can also improve profit margins for integrated circuits that are already profitable.

Although it is beneficial to enhance manufacturing yields whenever possible, it is generally not desirable to do so at the expense of performance or die size. Increases in yield that are achieved through the use of increased die sizes or less aggressive manufacturing techniques may not be acceptable in the marketplace due to issues such as poor power consumption and poor switching speeds.

One way to improve manufacturing yields while maintaining acceptable performance involves providing integrated circuits such as integrated circuit 10 with redundant circuitry. Following device fabrication, a newly fabricated integrated circuit can be tested. If a defect is detected, circuitry on integrated circuit 10 may be reconfigured to bypass the defect. In doing so, spare circuitry can be switched into use in place of the bypassed defect.

This type of redundancy scheme can help to improve manufacturing yields. Integrated circuits 10 that would otherwise need to be scrapped can be salvaged and sold to customers. The repair process need not adversely affect device performance, so repaired devices may operate just as well as devices in which no defects were detected. There are usually a limited number of defects on a given integrated circuit 10, so it is generally not necessary to provide a large amount of redundant circuitry. Because only a relatively small amount of redundant circuitry is provided, the increased die area and performance penalties associated with providing redundancy are typically outweighed by the considerable economic benefits that result from achieving enhanced manufacturing yields.

Figure 2:
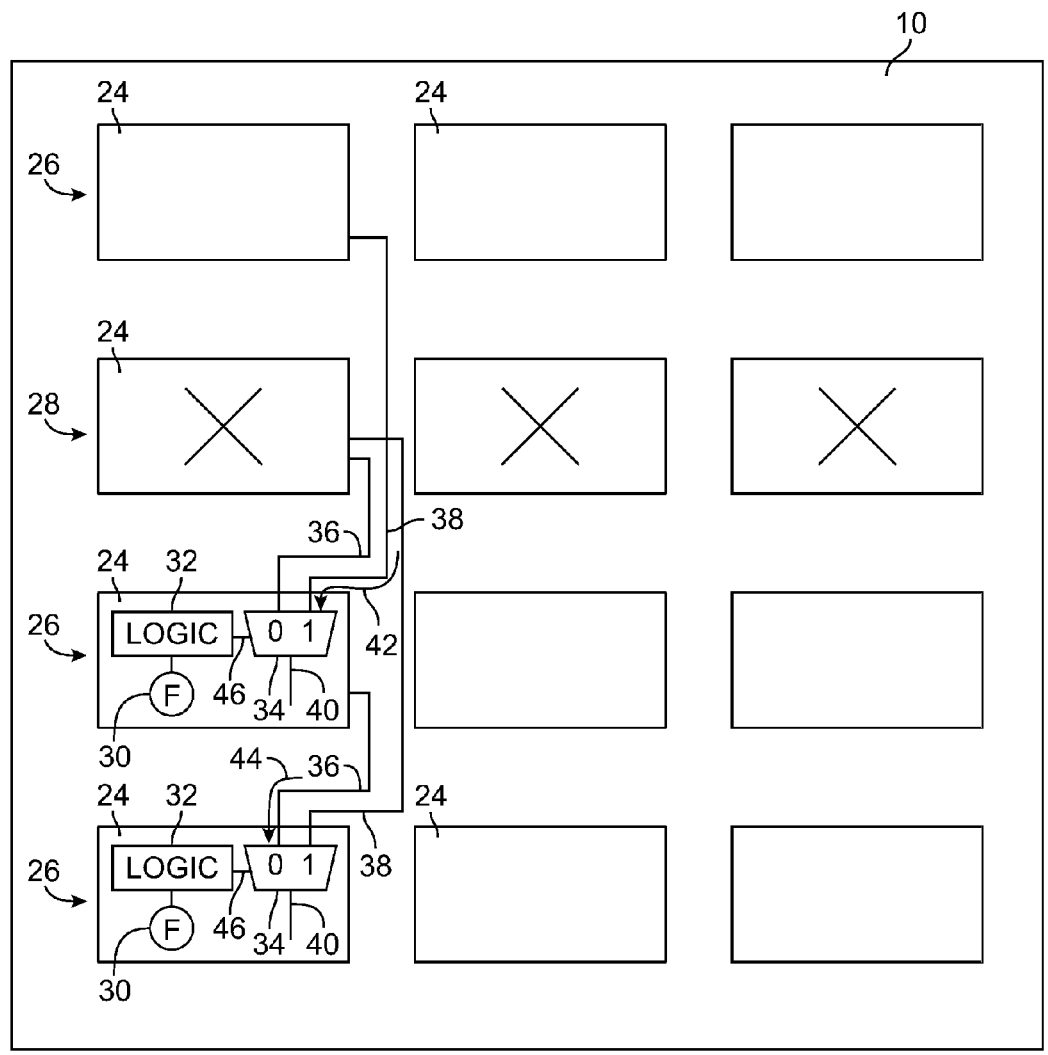
FIG. 2 is a diagram of an illustrative integrated circuit in which redundancy switching circuitry such as multiplexer circuitry is used in routing signals around defective circuits in accordance with an embodiment of the present invention.

An integrated circuit 10 with redundant circuitry in accordance with an embodiment of the present invention is shown in FIG. 2. As shown in the example of FIG. 2, integrated circuits 10 such as programmable logic device integrated circuits 10 may be provided that have blocks of circuits such as blocks 24. Blocks 24 may be any suitable regions of logic such as logic array blocks (as an example). The circuit blocks may include, for example, adders. Each circuit 10 may have spare rows or columns of blocks 24. This spare circuitry may be used to provide redundancy. In the example of FIG. 2, circuit 10 has a row of redundant circuitry (e.g., the bottom row of FIG. 2). In general, row redundancy and column redundancy configurations are interchangeable, because a row-redundancy scheme becomes a column-redundancy scheme when a circuit such as circuit 10 is rotated by 90°. Row redundancy schemes are sometimes described herein as an example.

Following fabrication, each integrated circuit 10 may be tested. If defective circuitry is identified, integrated circuit 10 may be repaired by switching the spare circuitry in circuit blocks 24 into place where appropriate using switching circuitry. With one suitable arrangement, which is sometimes described herein as an example, redundancy switching circuitry may be implemented using multiplexer circuitry. The use of redundancy multiplexers is, however, merely illustrative. Redundant circuitry may, in general, be switched into use using any suitable circuitry.

The circuitry of blocks 24 may have associated redundancy control circuits. The redundancy control circuits may be based on nonvolatile memory elements such as fuses (anti-fuses), electrically programmable read-only memory (EPROM) transistors, etc. In the example of FIG. 2, fuses 30 are used to provide control signals to logic 32, which in turn provides control signals to control inputs 46 of redundancy multiplexers 34. An advantage to forming redundancy control circuits from nonvolatile memory elements such as fuses is that this allows repaired circuits to be shipped in an unpowered state to end users. Because the repair information contained in nonvolatile redundancy circuits is not disturbed, the circuits in this type of arrangement permanently operate as if they are defect free once they have been repaired. If desired, redundancy schemes may be implemented using CRAM cells that are loaded with appropriate redundancy control data or may be implemented by circuitry that provides dynamic redundancy control signals (e.g., from an internal or external source). The use of an arrangement of the type shown in FIG. 2 in which static redundancy control signals (repair data) for controlling multiplexers 34 may be derived from the states of programmed fuses such as fuses 30 is merely illustrative.

In the FIG. 2 example, each row of circuit blocks 24 may have multiple redundancy multiplexers such as multiplexers 34. Each multiplexer 34 may have one input that receives data associated with a previous row (e.g., inputs 36 in the FIG. 2 example) and another input that receives data associated with the row above the previous row (e.g., inputs 38 in the FIG. 2 example). The previous row in an array of blocks 24 is sometimes referred to as ROW-1 and the row above the previous row is sometimes referred to as ROW-2.

In circuits without defects, each multiplexer 34 may be adjusted to route signals from its input 36 to its output 40. In circuits that contain a defect in a particular row, the multiplexers in the row below the defective row may be configured to bypass the defective row. In the example of FIG. 2, rows 26 do not contain defects and row 28 contains defective circuitry. To bypass the defective circuitry in row 28, the multiplexers such as multiplexer 34 in the row that is immediately below row 28 are configured to route their inputs 38 (which are connected to the outputs of blocks 24 that are located two rows above—i.e., to outputs associated with logic in row position ROW-2) to their outputs 40. The multiplexers 34 in other rows may be configured normally, so that their inputs 36 (which are connected to the outputs of blocks 24 that are located one row above—i.e., to outputs associated with logic in row position ROW-1) are connected to their outputs 40. With this type of arrangement, signals from the topmost row 26 bypass row 28 (as shown schematically by arrow 42), whereas signals from the second to last row and the last row of device 10 are routed along paths such as path 44.

Redundancy multiplexers may be used for routing any suitable signals on device 10 (e.g., signals associated with input-output pins 14, signals associated with interconnect buses, etc.). With one particularly suitable arrangement, redundancy multiplexers such as redundancy multiplexers 34 may be used for routing signals between adder circuitry in different blocks 24.

In integrated circuits such as programmable logic devices, it is often desirable to chain together adders in adjacent regions of logic to form wider adder circuits. For example, when implementing a particular logic design, it may be desirable to chain together an n-bit adder in one logic region with an n-bit adder in another logic region to form a 2n-bit adder. This allows data to be handled in words containing 2n bits.

The adder architecture that is used in an integrated circuit affects the performance of the combined adder circuit. For example, in a ripple carry adder architecture, the amount of time that it takes a carry signal to propagate through the adder's carry chain tends to scale with the number of bits in the adder. Carry select adders use carry select multiplexers to reduce the amount of time that it takes to output a valid sum, at the expense of increased circuit complexity.

Figure 3:
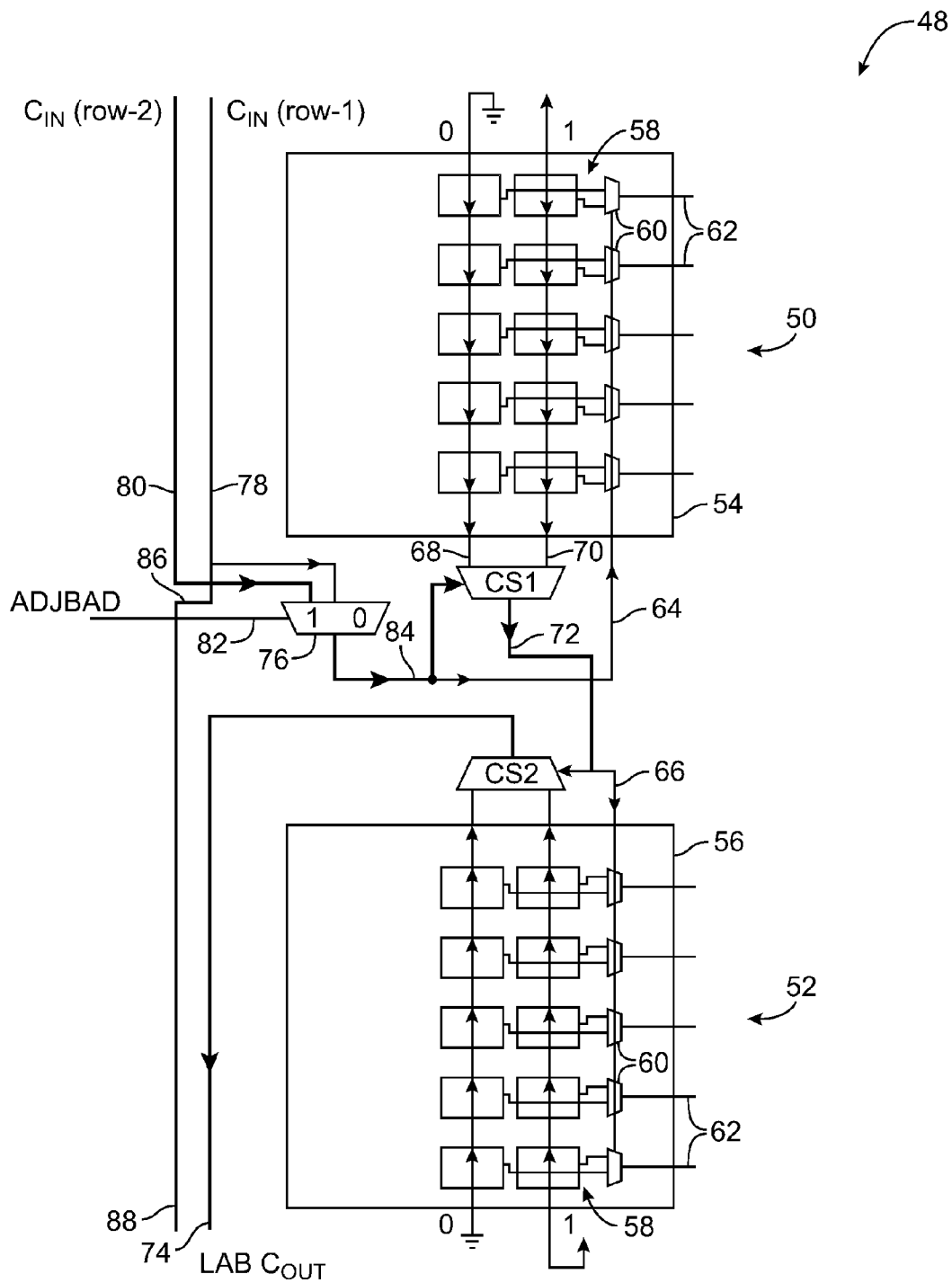
FIG. 3 is a diagram of a conventional adder circuit on a programmable logic device integrated circuit with redundancy circuitry.

In architectures such as these, the presence of redundancy multiplexers can introduce undesirable delays. Consider, as an example, the conventional programmable logic device integrated circuit adder arrangement of FIG. 3. In the arrangement of FIG. 3, the adder circuitry of two halves of a logic array block is combined to form a larger adder. Logic array block circuitry 48 of FIG. 3 includes circuitry 50 that is associated with a first (top) half of a logic array block and circuitry 52 that is associated with a second (bottom) half of a logic array block.

Circuitry 50 includes carry select adder 54. Circuitry 52 has carry select adder 56. Each adder includes a carry chain 58 having carry select multiplexers 60. Carry select multiplexers 60 are used to provide sum bits at their outputs 62 in response to control signals provided at control inputs 64 and 66.

Carry select multiplexers CS1 and CS2 are used to process carry signals produced by the adder circuits. In the example of FIG. 3, adders 54 and 56 have been combined to form a wider adder. Carry select multiplexer CS1 is used to select between the "0" carry signal on path 68 and the "1" carry signal on path 70. The carry signal output 72 of carry select multiplexer CS1 is provided to multiplexer control path 66 and to carry select multiplexer CS2 as a control signal. The output of carry select multiplexer CS2 represents the carry signal for the combined adder formed by adders 54 and 56. This carry signal is provided on output line 74 and may be referred to as LABCout. The signal LABCout is routed to the carry in path of a logic array block in the row of logic array blocks below logic array block 48, where this carry signal serves as a carry in signal.

Redundancy multiplexer 76 is used to select between carry in paths 78 and 80. Path 78 is associated with the carry in signal Cin (row-1) from a logic array block in a previous row and is selected by taking redundancy control signal ADJBAD low (to "0") on control input 82. Path 80 is associated with the carry in signal Cin(row-2) from a logic array block in the row above the previous row. When the row above the row of FIG. 3 contains a defect, the signal ADJBAD is set to a logic high signal, which directs multiplexer 76 to connect path 80 to output 84, thereby bypassing the defective circuitry.

Path 78 contains a twist 86, so that the output portion 88 associated with Cin(row-1) of path 78 at the bottom of the current row of circuitry is connected to the Cin(row-2) path of the next row. The LABCout signal on path 74 is connected to the Cin(row-1) path of the next row.

With an arrangement of the type shown in the conventional circuitry of FIG. 3, three multiplexer delays must be incurred before the carry signal LABCout will be valid. The path marked by the bold line in FIG. 3 shows how these delays are incurred. Initially, a carry signal is received by redundancy multiplexer 76. Multiplexer 76 selects between Cin(row-2) and Cin(row-1) depending on whether or not the previous row of logic contains a defect. A first multiplexer delay is therefore incurred when the carry signal passes through multiplexer 76. After passing through multiplexer 76, the carry signal is routed by path 84 to the control input of carry select multiplexer CS1. A second multiplexer delay is therefore incurred while waiting for the output of carry select multiplexer CS1 to become valid. As indicated by path 72, the output of carry select multiplexer CS1 is used as a control signal input to carry select multiplexer CS2. Carry select multiplexer CS2 is used in producing the carry signal output LABCout on path 74. A third multiplexer delay is therefore associated with multiplexer CS2.

In conventional adder architectures of the type shown in FIG. 3 in which adders from two halves of a logic array block are combinable to form larger-width adders and in which a multiplexer is provided to support redundancy, it is therefore necessary to incur the delays associated with multiplexer 76 and multiplexers CS1 and CS2. These three multiplexer delays limit circuit performance.

Figure 4:
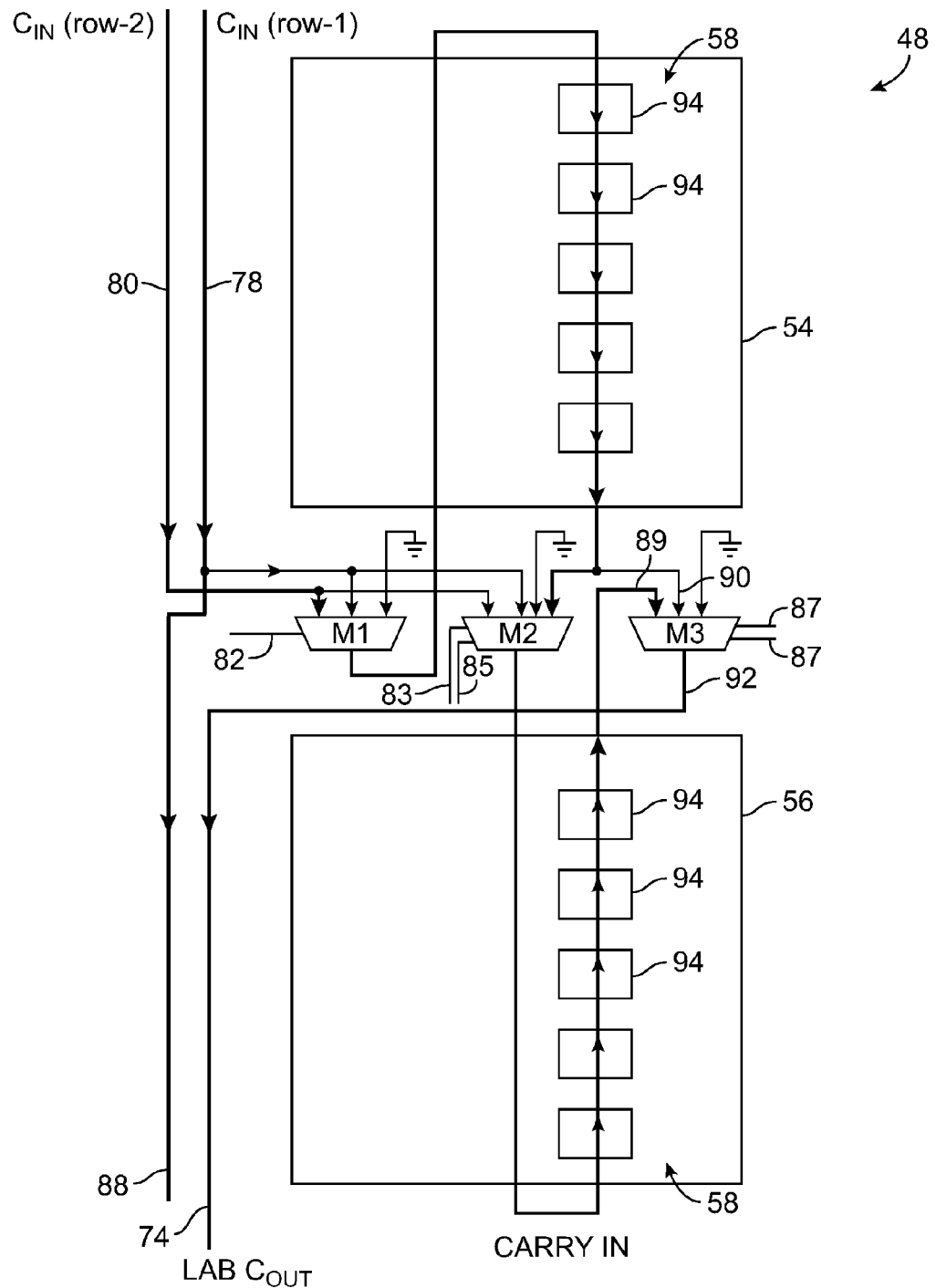
FIG. 4 is a diagram of another conventional adder circuit on a programmable logic device integrated circuit with redundancy circuitry.

Another conventional programmable logic device circuit with combinable adders and redundancy is shown in FIG. 4. In the example of FIG. 4, adders 54 and 56 are ripple carry adders. Adder 54 is associated with the top half of logic array block 48. Adder 56 is associated with the bottom half of logic array block 48. Carry chains 58 include two-bit carry select adder circuits 94.

Carry chains 58 from adders 54 and 56 are combined using configurable multiplexers M2 and M3. Multiplexer M1 is used to select between carry input signal Cin(row-2) on path 80 and carry input signal Cin(row-1) on path 78, in response to redundancy control signals provided on path 82. Because multiplexer M1 has three inputs, control path 82 may include two parallel control lines and may be used to convey a two-bit control signal to multiplexer M1. A first bit of the two-bit control signal is derived from fuse logic and may be used as a redundancy control signal (ADJBAD) which indicates that the adjacent row (ROW-1) is bad. A second bit of the two-bit control signal is provided by data loaded into a CRAM cell and may be used to select whether the top or bottom half of logic array block 48 of FIG. 4 is used. Multiplexer M2 also has two control inputs. Control input 83 receives signal ADJBAD and control input 85 receives a CRAM output signal. Multiplexer M3 is controlled by signals from two CRAM cells on inputs 87.

Multiplexer M2 is used to select the carry in signal for the bottom half of the logic array block. Multiplexer M3 is used to control the carry out signal LABCout for the logic array block. Multiplexer M3 connects input 90 to output 92 when it is desired to produce a carry out signal that is only computed using the adder resources of the top half of logic array block 48, or connects input 89 to output 92 when it is desired to route the carry out from the bottom half of logic block 48 to path 74 (i.e., when it is desired to use both the top and bottom half of the LAB).

The conventional arrangement of FIG. 4 produces carry out signals with three multiplexer delays and ripple carry delays. As indicated by the bold path originating with carry in signals Cin(row-2) and Cin(row-1), a first multiplexer delay is produced when the carry signal passes through multiplexer M1. The output from multiplexer M1 is used to as an input to the top adder 58 in top half 54. The output of the adder is used as an input to multiplexer M2, so an additional multiplexer delay is incurred by multiplexer M2. The output from multiplexer M2 is provided as an input to the bottom adder 58 in bottom half 56. The output of the bottom adder is provided as an input to multiplexer M3, so an additional multiplexer delay is produced by multiplexer M3. There are also delays associated with the ripple carry adder circuitry of adders 54 and 56 (each of which produces 5 ripple carry delays).

Because of the presence of multiplexers M1, M2, and M3, the conventional adder design of FIG. 4, which uses the adder resources of the top and bottom halves of logic array block 48, experiences three multiplexer delays and 10 ripple carry delays. These delays limit adder performance.

Figure 5:
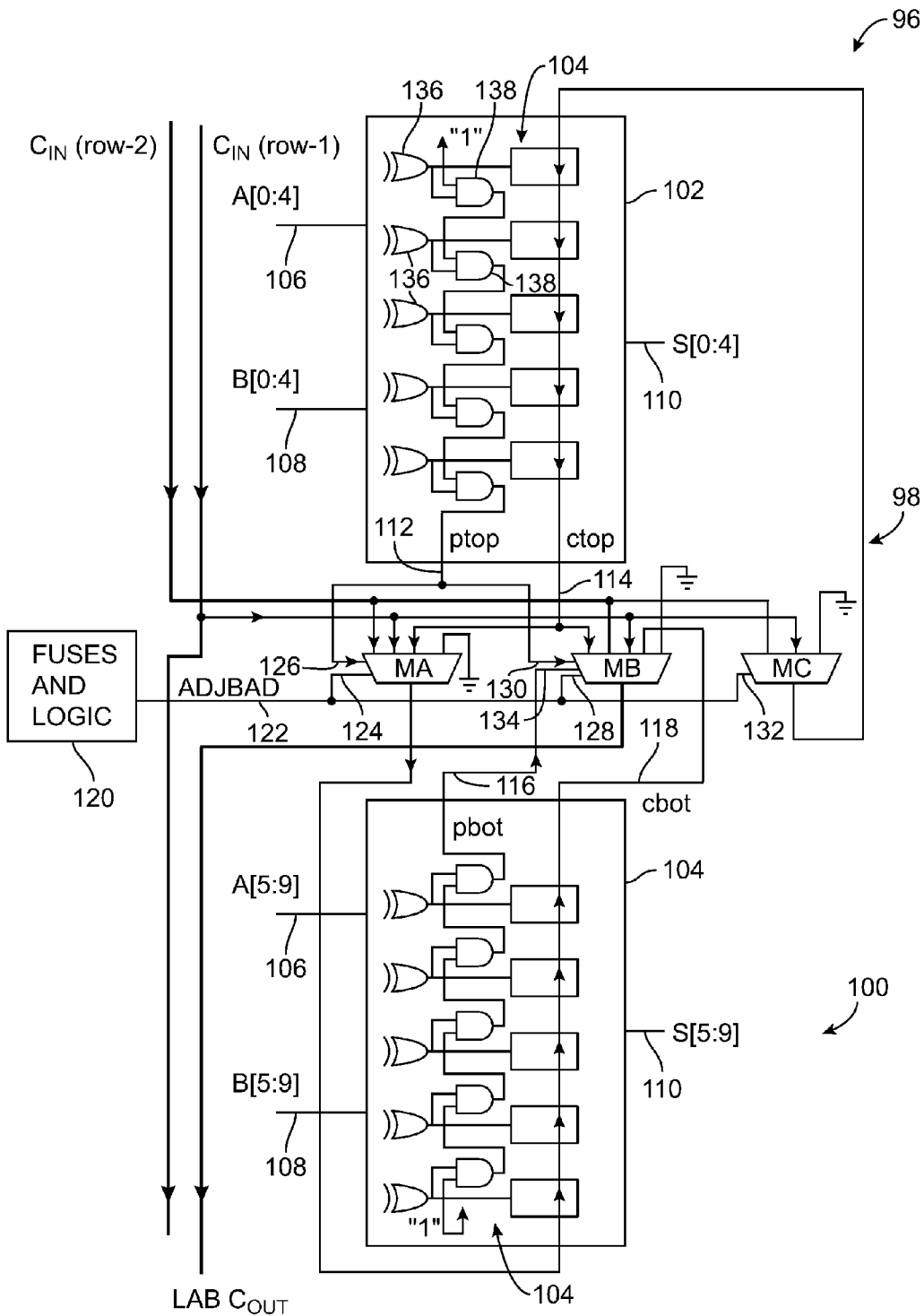
FIG. 5 is a diagram of an illustrative adder circuit on a programmable integrated circuit such as a programmable logic device integrated circuit with redundancy circuitry in accordance with an embodiment of the present invention.

An adder configuration in accordance with an embodiment of the present invention is shown in FIG. 5. Logic region 96 of FIG. 5 may be, for example, a single logic array block that makes up part of an array of logic array blocks on device 10. Row-based redundancy may be implemented by providing one or more spare rows of logic array blocks. If desired, the adder architecture of FIG. 5 may be used in integrated circuits other than programmable logic devices and in integrated circuit logic regions other than logic array blocks. The use of the adder arrangement of FIG. 5 in a logic array block on a programmable logic device integrated circuit is merely illustrative.

As shown in FIG. 5, logic array block 96 may have an upper portion such as top half 98 and a lower portion such as bottom half 100. Top half 98 may have an adder such as adder 102. Lower half 100 may have an adder such as adder 104. Adders 102 and 104 may be combined together to form a larger adder if desired. For example, if adders 102 and 104 are each five-bit adders, adders 102 and 104 may be combined to form a ten-bit adder. In this type of configuration, inputs A and B on input lines 106 and 108, respectively, may be added to produce sum S on output 110.

Adders such as adders 102 and 104 may be based on any suitable type of adder architectures (e.g., ripple carry, carry select, carry skip, carry look-ahead, etc.). In the example of FIG. 5, adders 102 and 104 are each shown as being five-bit ripple carry adders which can be combined to form a ten-bit ripple carry adder. Adder 102 produces propagate signal ptop at output 112 and produces carry signal ctop at output 114. Adder 104 produces propagate signal pbot at output 116 and carry signal cbot at output 118.

In a conventional carry skip adder architecture, adders produce propagate signals p and a carry out signal cout. Propagate signal p is high when the carry out is equal to the carry in signal. Because the carry out is equal to carry in when p is high, there is no possibility that a transition on carry in can affect carry out when p is low, so the carry in to carry out delay does not appear on the critical path of a carry skip adder. Although the invention applies to carry skip adders, other adders that provide a propagate signal p and a generate signal g may also be used with the invention. In these adders if the propagate signal is high, then again carry out will be equal to carry in, but if it is low then the generate signal can be used as a carry out, since there will only be a carry if the block generates a carry and hence the generate signal is equivalent to the carry out signal under the condition that p is low.

The invention applies to one or more groups of adders in a logic block. The description herein includes the ability to partition the adders into two groups and selectively use either all of the adders, or only the top half of adders in the logic block, as may be required to reduce the number of input signals to the block compared to using all of the adders.

As shown in FIG. 5, in configurable adder circuitry in accordance with the present invention, propagate signal ptop is routed to control input 126 of multiplexer MA and control input 130 of multiplexer MB. Carry signal ctop is routed to the inputs of multiplexers MA and MB. Signal pbot is used to produce control signals at control input 134 of multiplexer MB. (In the example of FIG. 5, inputs 130 and 134 are provided to multiplexer MB separately, but these signals may be combined using AND logic and provided on a single path if desired.) Signal cbot is provided as an input to multiplexer MB. Redundancy control signal ADJBAD may be supplied to control path 122 from a suitable source such as a CRAM bit, dynamic control logic, or, as shown in FIG. 5, nonvolatile memory such as fuse-based memory and associated control logic 120. The signal ADJBAD indicates whether an adjacent row of logic array blocks contains a defect and therefore needs to be bypassed. Redundancy control signal ADJBAD is provided to multiplexer control inputs 124, 128, and 132. Multiplexer circuitry MA, MB, and MC may also be configured using CRAM control signals. For example, a static control signal from a CRAM bit may be used to direct multiplexer MC to connect its grounded input (the input tied to ground) to its output.

Multiplexers MA, MB, and MC also receive other control signals typically generated by CRAM bits to control the mode of operation of the adder. Decoding logic may be provided in the multiplexers. The decoding logic may be used to determine how the multiplexers behave in response to various combinations of control inputs. For example, a multiplexer with 3 control inputs would nominally require 8 data inputs, but if some of the data inputs are in common, a decoder can be used to enable a single path for each of the unique data inputs. This can save area and improve the speed of the data path, since the data path may be required to be faster and hence larger compared to the control path.

Figure 13:
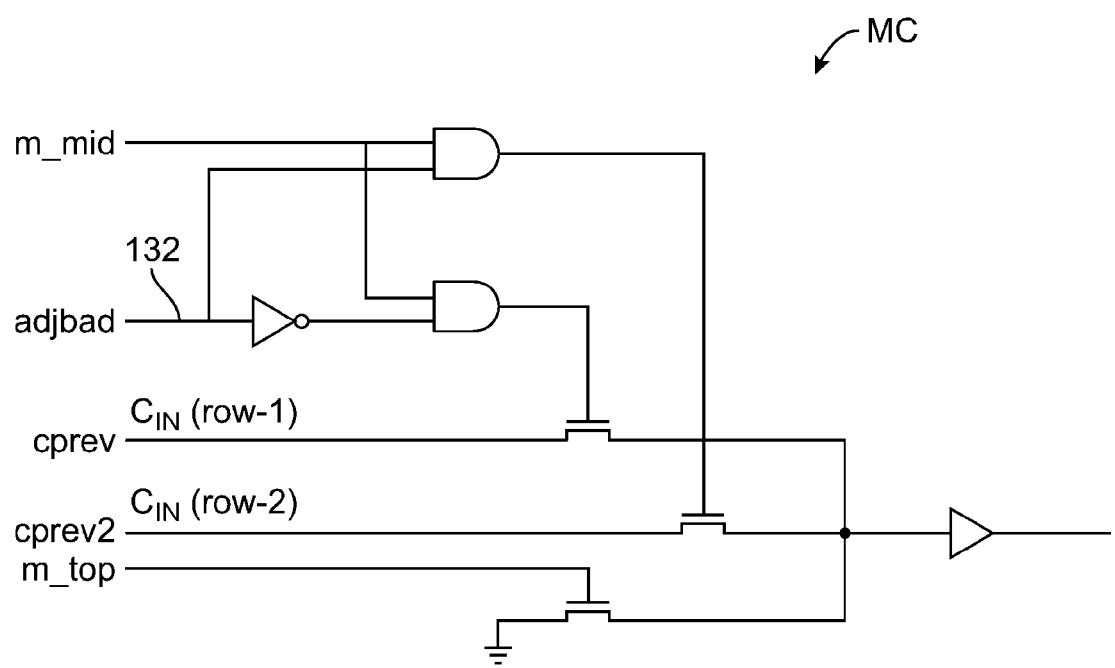
FIG. 13 is a diagram of an illustrative multiplexer with decoding logic at its input in accordance with an embodiment of the present invention.

An example of a multiplexer MC with decoding logic at its input is shown in FIG. 13. The table of FIG. 6 sets forth how multiplexer MC operates in various modes. From the contents of the table of FIG. 6, it can be seen that one of the signals Cin(row-1), Cin(row-2), or a logical 0 is selected based on the conditions expressed in the table (i.e., in response to signal ADJBAD and CRAM mode control signals m_mid and m_top. The illustrative multiplexer with decoding capabilities of FIG. 6 has a single pass transistor and buffer in its data path. Similar designs may be used for the other multiplexers of FIG. 5 (and their decoders) to implement the operational behavior set forth in the tables of FIGS. 7 and 8.

As this example demonstrates, each of the multiplexers of FIG. 5 may receive mode control signals (e.g., top/mid/off, etc.) and may predecode these signals using decoder logic in the multiplexers to control the pass transistors in the multiplexers.

The operation of the adder circuitry of FIG. 5 in various modes is set forth in the diagrams of FIGS. 6, 7, and 8. In "top" mode, logic array block 96 forms the first adder in a chain of one or more logic array block adder circuits. In "middle" mode, logic array block 96 can be used as the second or subsequent adder in an adder chain. In "off" mode, logic array block 96 is off and LABCout is set to a known (low) value. In "tophalf" mode adder 98 forms the first adder in a chain of one or more logic array block adder circuits and bottom half 100 is not used. In "skipbot" mode adder 98 can be used as second or subsequent adder in a chain and bottom half 100 is not used. The table of FIG. 6 illustrates the operation of multiplexer MC. The table of FIG. 7 illustrates the operation of multiplexer MA. The table of FIG. 8 illustrates the operation of multiplexer MB.

As shown in the table of FIG. 8, when the LAB is in "top" mode, the value of LABCout is cbot whenever pbot is low and ctop otherwise. When performing addition in the "middle" mode illustrated in rows R1 and R2 of the FIG. 8 table, a valid LABCout signal is produced with only a single multiplexer delay from the Cin from either of the two previous rows. The multiplexer may be designed to decode the various combinations of mode, redundancy, and dynamic signals illustrated in the rows of the table, and to transmit each of the specified input values to the output with a small delay. If the previous row of logic array block circuitry is defective, signal ADJBAD will be high and the LABCout carry signal will be equal to Cin(row-2). If the previous row of logic array block circuitry is operating properly, signal ADJBAD will be low and the LABCout carry signal will be equal to Cin(row-1).

In FIG. 5, the internal logic of adders 102 and 104 has been expanded to show how a propagate function may be provided by XOR gates 136 and an additional block carry propagate function may be provided by AND gates 138. The XOR gates 136 provide a bit level propagate function that can also be used in the computation of the sum function. A propagate signal may be generated across any suitable number of bits if desired. Both the propagate signals ptop and pbot and redundancy signal ADJBAD are used in controlling multiplexer MB.

The inputs to multiplexer MB include ctop, Cin(row-2), Cin(row-1), cbot, and a fixed logic zero (to be used to place the carry out in a known state if the logic array block adder circuitry is not being used). Multiplexer MB selects among these inputs and produces a corresponding output for signal LABCout, as shown in FIG. 8. As a result, the carry-in-tocarry-out path across logic array block circuitry 96 involves only a single multiplexer data-in-to-data-out delay. There is minimal additional hardware required to implement the arrangement of FIG. 5 over conventional arrangements, as only additional AND gates and appropriate multiplexer circuitry is required. An advantage of the FIG. 5 adder arrangement is that the speed of carry propagation across multiple logic array blocks can be significantly increased.

If desired, a multiple-bit propagate signal may be produced that does not involve the circuitry of an entire logic array block. For example, the adder circuitry can be arranged so as to merge redundancy multiplexer functionality and a carry skip function for the top half of the logic array block to produce a carry input for the bottom half of the logic array block, while a second carry skip multiplexer uses a propagate function to produce the logic array block carry out. In this embodiment, two multiplexer delays are incurred in the carry path.

As the example of FIGS. 5-8 demonstrates, adder circuits may be provided in which propagate signals and redundancy control signals (and control signals from CRAM bits) control multiplexer circuitry that is used in routing carry signals. The solid lines of FIG. 5 illustrate how only a single multiplexer delay (from multiplexer MB) need be incurred on the carry in to carry out path for the logic array block. The multiplexer circuitry generally includes a multiplexer such as multiplexer MB that receives at least two carry signals from different rows of logic such as Cin(row-1) and Cin(row-2). The adder circuits are used to add a first group of bits (e.g., signal A) to a second group of bits (e.g., signal B) to produce a corresponding sum (S). The propagate signals that are formed by the adder circuits are indicative of whether a carry in to the first and second groups of bits will propagate to the carry out path for that group of bits (e.g., as signal LABCout).

Figure 9:
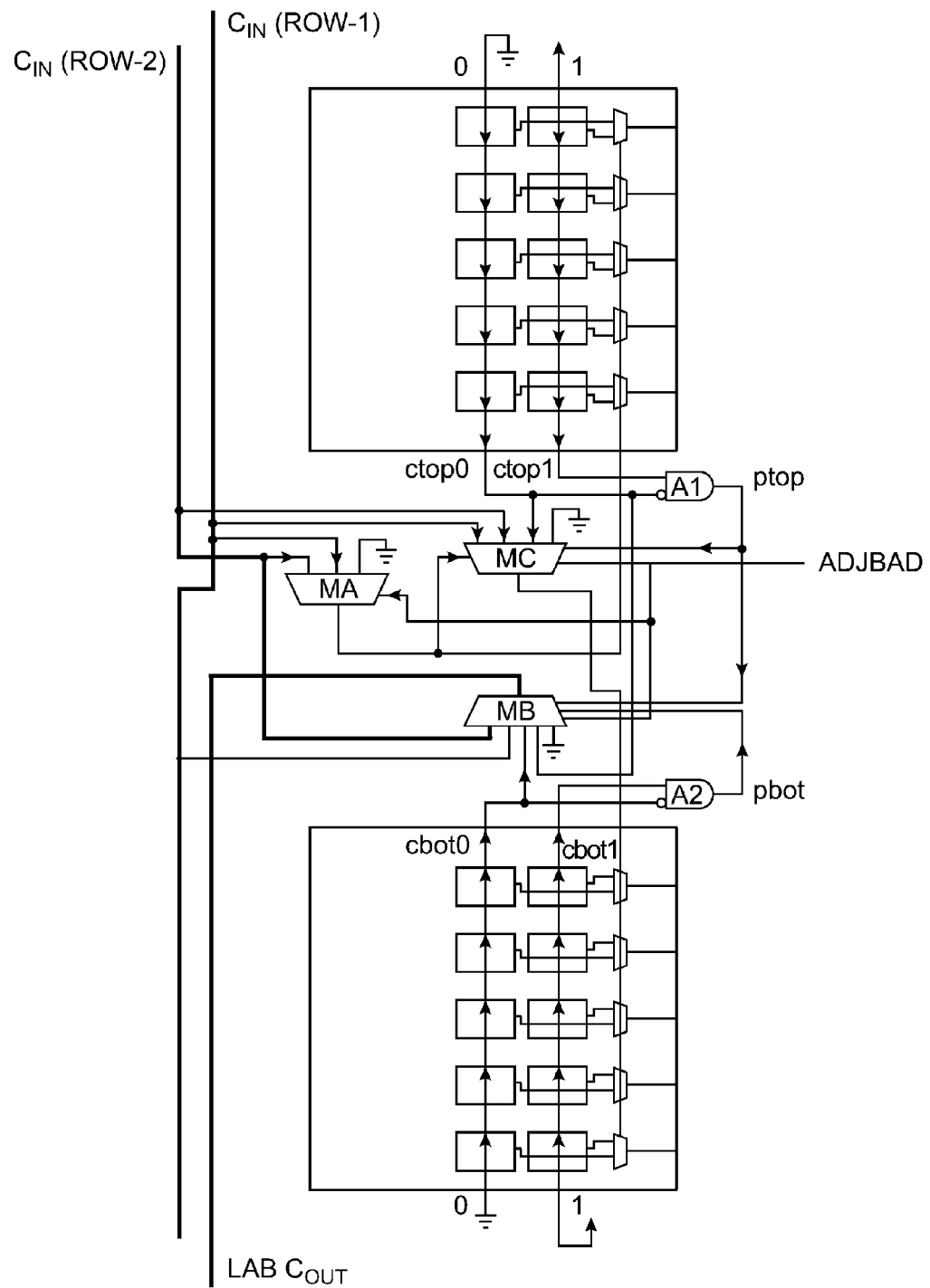
FIG. 9 is a diagram of another illustrative adder circuit on a programmable integrated circuit such as a programmable logic device integrated circuit with redundancy circuitry in accordance with an embodiment of the present invention.

If desired, the adder circuits can be based on carry select adder architectures by using a carry skip structure between logic array blocks and a carry select structure within logic array blocks (as an example). This type of arrangement, which is illustrated in FIG. 9 and the operating mode tables of FIGS. 10, 11, and 12, may be used to maximize speed at the expense of increased circuit real estate. As shown in FIG. 9, AND gates A1 and A2 may be used to produce propagate signals ptop and pbot. The propagate signals are used as control inputs to multiplexer MB. Carry signals cout(cin=0) (i.e., ctop0) and cout(cin=1) (i.e., ctop1) can be used to form propagate signal ptop. Propagate signal pbot may be formed from cbot0 and cbot1. A carry will only propagate across a group of bits if the "cout(cin=0)" and "cout(cin=1)" carry signals have different values. Because the only way that these values can differ is if cout(cin=0)=0 and cout(cin=1)=1, the carry out will be identical to carry in if the cout signals have these respective values. This situation can be detected with an AND with one inverted input (e.g., AND gates A1 and A2). If cout(cin=0)=0 and cout(cin=1)=1, the carry will propagate (skip) across that group of bits. Otherwise, the carry will not propagate across that group of bits, and either one of the values may be used as the carry out, because they are identical. The bold lines of FIG. 9 demonstrate how the adder circuitry may introduce only a single multiplexer delay (from multiplexer MB) in the carry chain path.

In the illustrative arrangements of FIGS. 5 and 9, multiplexer MB has a local carry input. In the FIG. 5 example, the local carry input is provided in the form of the ctop and cbot signals. In the FIG. 9 example, the local carry input is provided in the form of the ctop0 and cbot0 signals. These local carry signals serve as the carry out of the adder when the propagate signal is low (i.e., ptop/pbot is low). Because the ctop0 and ctop1 signals are identical in the case that ptop=1, it is immaterial which one is used as a carry out in this circumstance, and similarly with cbot0/cbot1 and pbot. The arrangement of FIG. 9 is substantially the same as the arrangement of FIG. 5 with the exception that the ptop and pbot signals are derived from the two carry chain outputs, and the choice of which of the two outputs to produce as the carry out from the block.

Because adder architectures such as the adder architectures of FIGS. 5 and 9 allow adders of suitable widths to be constructed in integrated circuits with redundancy without introducing excessive multiplexer delays, adder performance can be enhanced while maintaining a desired level of circuit flexibility.

The foregoing is merely illustrative of the principles of this invention and various modifications can be made by those skilled in the art without departing from the scope and spirit of the invention.

What is claimed is:

1. Circuitry comprising:
   adder circuitry; and
   a multiplexer having a first input, a second input, and a control input, wherein the control input comprises a first control input path that receives a static redundancy control signal and a second control input path that receives dynamic control signals from the adder circuitry.

2. The circuitry defined in claim 1 wherein the dynamic control signals comprise a propagate signal and wherein the second control input path comprises a propagate signal path that supplies the propagate signal to the control input of the multiplexer.

3. The circuitry defined in claim 2 further comprising fuse and logic circuitry that produces the static redundancy control signal.

4. The circuitry defined in claim 1 further comprising nonvolatile memory and logic circuitry that produce the static redundancy control signal.

5. The circuitry defined in claim 4 wherein the nonvolatile memory comprises fuses, wherein the dynamic control signals comprise a first adder propagate signal and a second adder propagate signal, wherein the first and second adder propagate signals are produced by the adder circuitry in response to a plurality of input bits, and wherein the multiplexer has an output at which the multiplexer produces a carry output for the plurality of input bits.

6. The circuitry defined in claim 5 further comprising a first adder and a second adder in the adder circuitry, wherein the first input receives a carry signal from the first adder, wherein the second input receives a carry signal from the second adder, wherein the first adder produces the first adder propagate signal, and wherein the second adder produces the second adder propagate signal.

7. The circuitry defined in claim 1 further comprising a first adder and a second adder in the adder circuitry, wherein the first input receives a carry signal from the first adder and the second input receives a carry signal from the second adder.

8. The circuitry defined in claim 1 further comprising:
   a logic region on a programmable logic device integrated circuit, wherein the logic region includes the adder circuitry; and
   a first adder and a second adder in the adder circuitry of the logic region, wherein the first input receives a carry signal from the first adder and the second input receives a carry signal from the second adder.

9. The circuitry defined in claim 8 wherein the multiplexer further comprises an input that receives a carry signal from another logic region.

10. The circuitry defined in claim 9 wherein the multiplexer comprises one of three multiplexers in the logic region, wherein each of the three multiplexers is controlled by the same static redundancy control signal, and further comprising at least one fuse from which the static redundancy control signal is derived.

11. The circuitry defined in claim 1 wherein the multiplexer is contained within an integrated circuit, the circuitry further comprising redundant circuitry on the integrated circuit that is switched into use by the static redundancy control signal when the integrated circuit contains defective circuitry.

12. A configurable adder circuit in a logic region on a programmable integrated circuit, comprising:
nonvolatile memory and logic that produces a static redundancy control signal that has a value that depends on whether the programmable integrated circuit contains defective circuitry;
a first adder in a first portion of the logic region;
a second adder in a second portion of the logic region; and
at least one multiplexer that provides an adder carry output signal for the logic region when the first and second adders are combined, wherein the multiplexer comprises control inputs that receive the static redundancy control signal and at least one other control signal provided by the first adder.

13. The configurable adder circuit defined in claim 1 wherein the first and second adder comprise a first set of input lines that receive a first group of bits and a second set of input lines that receive a second group of bits and an output at which a sum of the first and second groups of bits is provided, wherein the first adder has a first propagate output, wherein the second adder has a second propagate output, and wherein the first and second propagate outputs are coupled to the multiplexer control inputs.

14. The configurable adder circuit defined in claim 13 wherein the multiplexer has a first control input path, a second control input path, and a third control input path, wherein the first control input path receives the first propagate output, wherein the second control input path receives the second propagate output, and wherein the third control input path receives the static redundancy control signal.

15. The configurable adder circuit defined in claim 14 wherein the programmable integrated circuit comprises a programmable logic device integrated circuit having a plurality of rows and columns of logic array blocks, wherein the configurable adder circuit is located in a given one of the logic array blocks, and wherein the nonvolatile memory comprises at least one fuse.

16. The configurable adder circuit defined in claim 15 wherein the given one of the logic array blocks is located in a given row of logic array blocks, wherein the multiplexer comprises a first input that receives a carry signal from a first logic array block and a second input that receives a carry signal from a second logic array block, wherein the first logic array block is located in a row adjacent to the given row, and wherein the second logic array block is located in a row adjacent to the row containing the first logic array block.

17. The configurable adder circuit defined in claim 16 wherein the multiplexer further comprises a third input that receives a carry signal from the first adder and a fourth input that receives a carry signal from the second adder.

18. The configurable adder circuit defined in claim 17 wherein the multiplexer further comprises a fifth input that receives a logic low signal.

19. A programmable logic device integrated circuit comprising:
a plurality of rows of logic regions;
nonvolatile memory and logic circuitry that produces at least one redundancy control signal that has first logic value when the programmable logic device integrated circuit contains no defective circuitry and that has a second logic value when the programmable logic device integrated circuit contains defective circuitry, wherein the second logic value is different than the first logic value; and
first and second adders and at least one multiplexer in each logic region, wherein the multiplexer in each logic region has a first input that receives carry signals from the first adder, a second input that receives carry signals from the second adder in the same logic region as the first adder, and at least one control input that receives the static redundancy control signal, wherein the multiplexer in each logic region is contained in one of the rows and wherein at least a given one of the multiplexers is located in a given one of the rows and has a third input that receives a carry signal from adder circuitry in a first row other than the given one of the rows and has a fourth input that receives a carry signal from adder circuitry in second row other than the given one of the rows.

20. The programmable logic device integrated circuit defined in claim 19 wherein the given multiplexer has a propagate signal control input that receives at least one dynamically varying propagate signal produced by the first adder.

21. A method of controlling a multiplexer in a logic region that contains first and second adders, wherein the multiplexer has inputs, an output, and a control input path at which control signals are received that determine which of the inputs is routed to the output, comprising:
receiving carry signals from the first and second adders in the same logic region at the inputs to the multiplexer; and
receiving a static redundancy control signal and at least one dynamic control signal at the control input path.

22. The method defined in claim 21 wherein the logic region is contained in a given row of logic regions, the method further comprising receiving a first carry signal at the inputs to the multiplexer from a logic region in a row of logic regions that is adjacent to the given row and receiving a second carry signal at the inputs to the multiplexer from a logic region in a row of logic regions that is adjacent to the row of logic regions that is adjacent to the given row, wherein the row of logic regions that is adjacent to the row of logic regions that is adjacent to the given row is different from the given row.

23. The method defined in claim 22 wherein receiving the dynamic control signal comprises receiving at least one propagate signal from the first adder at the control input path.

* * * * *